(12) United States Patent
Toshima et al.

(10) Patent No.: US 6,713,239 B2
(45) Date of Patent: Mar. 30, 2004

(54) DEVELOPING METHOD AND DEVELOPING APPARATUS

(75) Inventors: Takayuki Toshima, Yamanashi-Ken (JP); Tsutae Omori, Shirane-Machi (JP); Yoshio Kimura, Koshi-Machi (JP)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 10/108,382

(22) Filed: Mar. 29, 2002

(65) Prior Publication Data
US 2002/0122670 A1 Sep. 5, 2002

Related U.S. Application Data

(62) Division of application No. 09/524,282, filed on Mar. 13, 2000, now Pat. No. 6,398,429.

(30) Foreign Application Priority Data

Mar. 15, 1999 (JP) ............................................. 11-67981

(51) Int. Cl.[7] ................................................ G03F 7/30
(52) U.S. Cl. ....................... 430/328; 430/156; 430/326; 430/327; 430/330
(58) Field of Search ................. 430/156, 326, 430/327, 328, 330

(56) References Cited

U.S. PATENT DOCUMENTS

| | | | | |
|---|---|---|---|---|
| 4,609,614 A | * | 9/1986 | Pampalone et al. | 430/323 |
| 4,814,258 A | * | 3/1989 | Tam | 430/315 |
| 4,835,086 A | * | 5/1989 | Jain | 430/312 |
| 4,863,827 A | * | 9/1989 | Jain et al. | 430/145 |
| 5,227,280 A | * | 7/1993 | Jubinsky et al. | 430/312 |
| 5,252,137 A | | 10/1993 | Tateyama et al. | 134/34 |
| 5,360,698 A | * | 11/1994 | Hanrahan | 430/324 |
| 5,455,145 A | | 10/1995 | Tarumoto | 430/325 |
| 5,625,433 A | | 4/1997 | Inada et al. | 396/604 |
| 5,626,913 A | | 5/1997 | Tomoeda et al. | 427/299 |
| 5,964,954 A | | 10/1999 | Matsukawa et al. | 134/902 |
| 6,040,118 A | | 3/2000 | Capodieci | 430/328 |
| 6,127,279 A | | 10/2000 | Konuma | 438/745 |
| 6,136,614 A | | 10/2000 | Funk | 438/5 |
| 6,398,429 B1 | * | 6/2002 | Toshima et al. | 396/611 |
| 6,613,499 B2 | * | 9/2003 | Chang | 430/325 |

FOREIGN PATENT DOCUMENTS

| | | |
|---|---|---|
| JP | 62-165651 | 1/1987 |
| JP | 03-124017 A | 5/1991 |

* cited by examiner

Primary Examiner—John S. Chu
(74) Attorney, Agent, or Firm—Rader, Fishman & Grauer PLLC

(57) ABSTRACT

A solution having a photosensitive radical is applied onto a resist film, a developing solution is applied thereonto, and the entire surface of the solution having the photosensitive radical is exposed all at once. Developing of the resist film progresses all at once after a coating film of the solution having the photosensitive radical dissolves in the developing solution, and hence time difference in the start time of developing does not occur in the surface of a substrate, thereby enabling uniform developing and an improvement in line width uniformity (CD value uniformity) in the surface of the substrate.

10 Claims, 6 Drawing Sheets

DEVELOPING METHOD AND DEVELOPING APPARATUS

This application is a Division of Ser. No. 09/524,282 filed on Mar. 13, 2002 now U.S. Pat. No. 6,398,429.

BACKGROUND OF THE INVENTION

1. Field of the Invention

The present invention relates to a developing method and a developing apparatus each for exposing a resist film formed on a substrate such as a semiconductor wafer, an LCD substrate, or the like in a predetermined pattern and thereafter developing the exposed pattern.

2. Description of the Related Art

In a coating and developing system for a photolithography process in processes of semiconductor device fabrication, for example, resist coating processing for forming a resist film on the front surface of a semiconductor wafer and developing processing for performing exposure processing for the resist-coated semiconductor wafer and thereafter developing the wafer are performed.

In the developing processing, the wafer which has undergone exposure in a predetermined pattern, post-exposure bake processing and cooling processing is carried into a developing unit to be mounted on a spin chuck. A developing solution is supplied from a developing solution supply nozzle and applied (heaped up) so as to have a thickness of 1 mm, for example, on the entire surface of the semiconductor wafer, and thus a developing solution puddle is formed. The wafer stands still for a predetermined period of time with the developing solution puddle being formed, and developing processing progresses by natural convection. Thereafter, the developing solution is blown off by the semiconductor wafer being rotated by the spin chuck, and then a rinse solution is discharged from a rinse solution supply nozzle to wash away the developing solution remaining on the wafer. Subsequently, the spin chuck is rotated at a high speed, whereby the developing solution and the rinse solution remaining on the semiconductor wafer are blown away so that the wafer is dried. Thus, a series of developing processing is completed.

When the developing solution puddle is formed in this developing processing, nozzles of various shapes are used for applying the developing solution onto the entire surface of the semiconductor wafer, and the wafer is rotated and the nozzle is scan-moved while the developing solution is being discharged from the nozzle.

SUMMARY OF THE INVENTION

In the aforesaid prior developing method, however, the time to heap up the developing solution, impact at the time of supply of the developing solution, displacement speed of the developing solution, and the like are uneven in the surface of the semiconductor wafer by any means when the developing solution puddle is formed on the semiconductor wafer, thereby making it difficult to obtain uniformity of line width. Moreover, defects are prone to occur due to entrance of bubbles in heaping up the liquid and the like.

Recently, with high integration of devices from 64 megabytes to 256 megabytes, it is increasingly demanded to make circuit patterns more minute, and the minimum line width almost reaches a super-submicron region of not more than 0.2 $\mu$m. In order to meet the demand, a chemically amplified resist is used as a resist capable of micromachining, but the chemically amplified resist has poor wettability for the developing solution, so that the aforesaid defects are prone to occur. When micromachining is performed with the chemically amplified resist, the ununiformity of line width due to the aforesaid unevenness becomes remarkable.

An object of the present invention is to provide a developing method and developing apparatus in each of which line width can be made uniform and defects do not tend to occur during the coating of the developing solution.

To attain the above object, a first aspect of the present invention is a developing method for exposing a resist film formed on a substrate in a predetermined pattern and thereafter developing the exposed pattern, comprising the steps of (a) applying a solution having a photosensitive radical onto the entire upper surface of the resist film on the substrate, (b) applying a developing solution onto the entire upper surface of the applied solution, and (c) exposing the entire surface of the solution having the photosensitive radical applied onto the resist film.

A second aspect of the present invention is a developing method for exposing a resist film formed on a substrate in a predetermined pattern and thereafter developing the exposed pattern, comprising the steps of (a) applying a solution having a photosensitive radical onto the entire upper surface of the resist film on the substrate, (b) applying a developing solution onto the entire upper surface of the applied solution, and (c) exposing the entire surface of the solution having the photosensitive radical applied onto the resist film via the developing solution and developing the resist film by the developing solution and the dissolved solution.

A third aspect of the present invention is a developing apparatus for exposing a resist film formed on a substrate in a predetermined pattern and thereafter developing the exposed pattern, comprising a first coating mechanism for applying a solution having a photosensitive radical onto the entire upper surface of the resist film on the substrate, a second coating mechanism for applying a developing solution onto the entire upper surface of the applied solution, and an exposure mechanism for exposing the entire surface of the solution having the photosensitive radical.

It is preferable to form an interlayer between the solution having the photosensitive radical and the resist film. If the solution having the photosensitive radical directly touches the resist film when the solution having the photosensitive radical is an organic series, the resist dissolves in the solution, whereby the interlayer is provided to prevent the above phenomenon. In this case, it is preferable to use water soluble resin, for example, polyvinyl alcohol (PVA) is used as the interlayer. A water soluble solution is preferable as the solution having the photosensitive radical. In this case, the interlayer is not necessarily needed.

Moreover, it is preferable to perform an all-at-once exposure step after a developing solution applying step in terms of certain progress of the developing of the resist film all at once. Even if the developing solution applying step is performed after the all-at-once exposure step, a coating film of the solution having the photosensitive radical dissolves in the developing solution, whereby time difference in the start time of developing of the resist film is not prone to occur. Accordingly, the developing solution applying step may be performed after the all-at-once exposure step.

A G-line resist solution can be used as the solution having the photosensitive radical. The G-line resist has a function of raising the developing rate by being dissolved by the developing solution, which can reduce the developing time nearly to half.

According to the present invention, the solution having the photosensitive radical is applied onto the resist film, and the developing solution is applied thereonto, and thereafter the entire surface of the solution having the photosensitive radical is exposed all at once, for example, whereby developing of the resist film progresses all at once after the coating film of the solution having the photosensitive radical dissolves in the developing solution. Consequently, time difference in the start time of developing does not occur in the surface of the substrate, thereby enabling uniform developing and improving line width uniformity (CD value uniformity) in the surface of the substrate. Further, since developing progresses all at once after the developing solution is applied, the time to heap up the developing solution is not restricted and the reduction of impact of the developing solution and the like do not need to be considered. As a result, a developing solution nozzle can be structured more simply. Furthermore, the developing solution does not directly attack the resist film, thereby decreasing defects.

These objects and still other objects and advantages of the present invention will become apparent upon reading the following specification when taken in conjunction with the accompanying drawings.

DETAILED DESCRIPTION OF THE PREFERRED EMBODIMENT

Preferred embodiments of the present invention will be explained concretely below with reference to the attached drawings.

Figure 1:
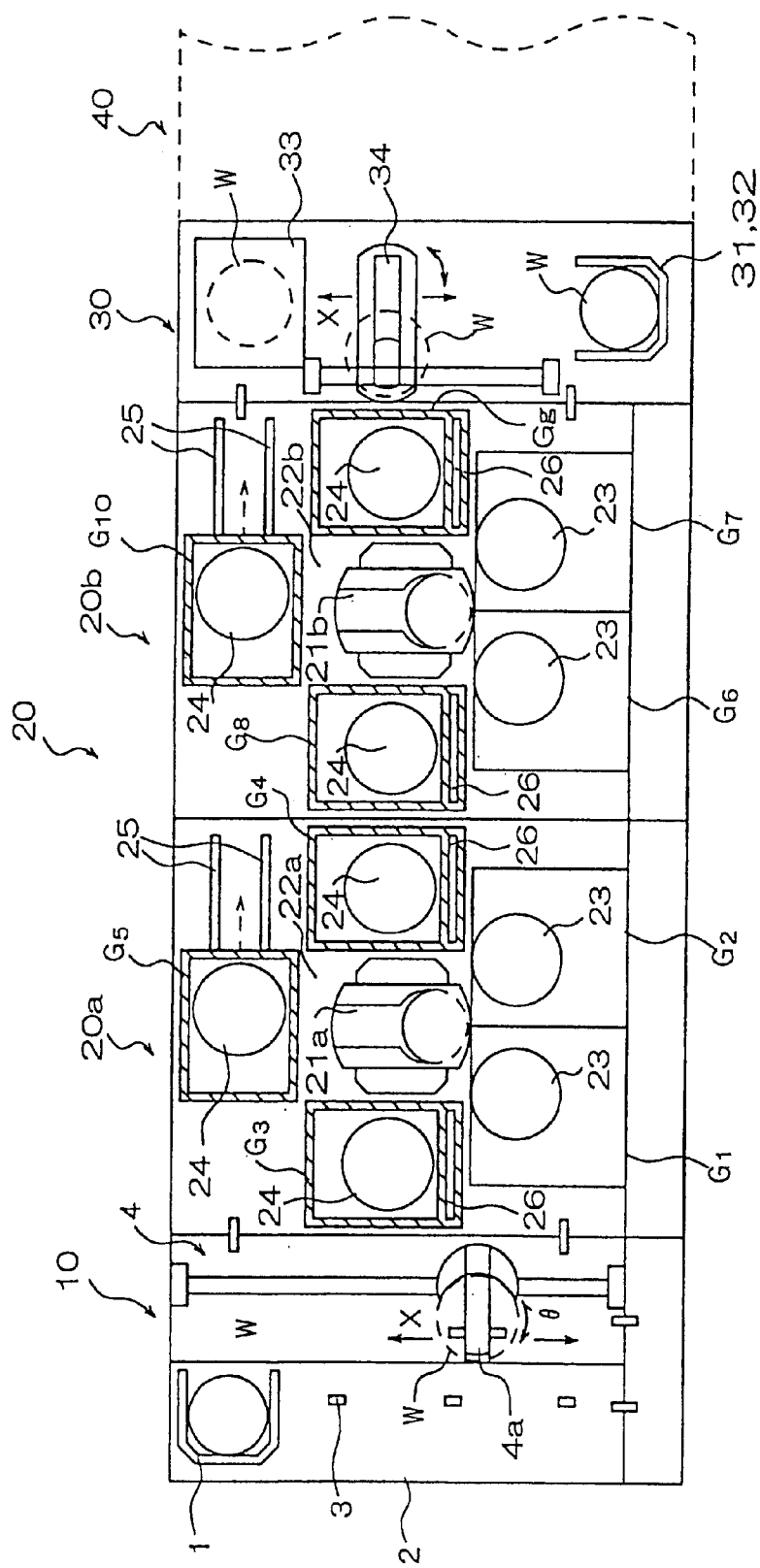
FIG. 1 is a schematic plan view showing a resist solution coating and developing system used for embodying the present invention.
Figure 2:
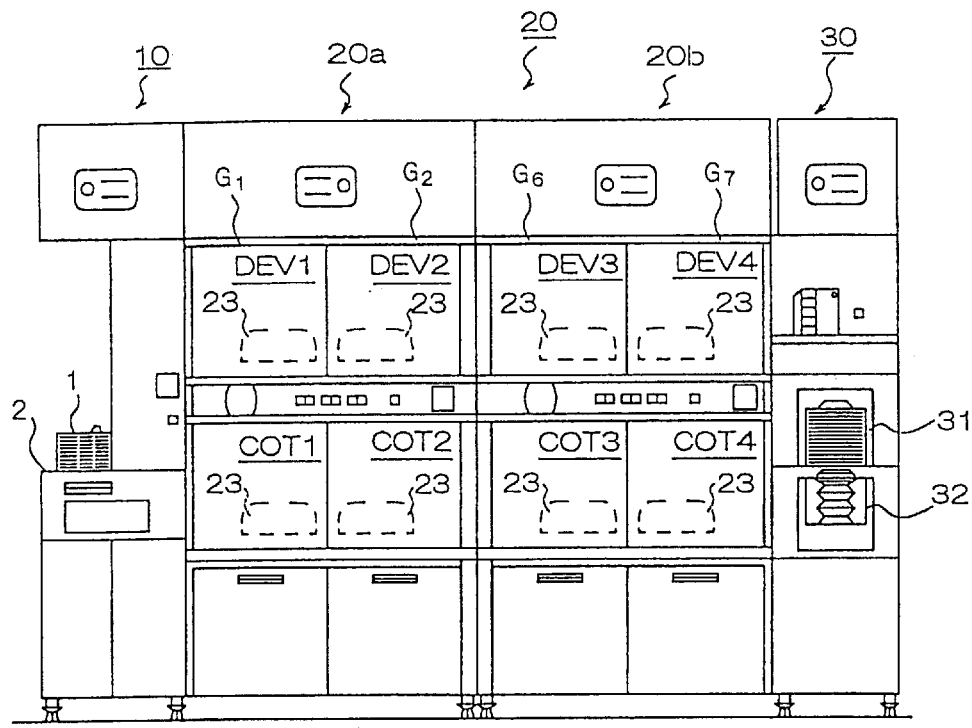
FIG. 2 is a front view showing the resist solution coating and developing system in FIG. 1.
Figure 3:
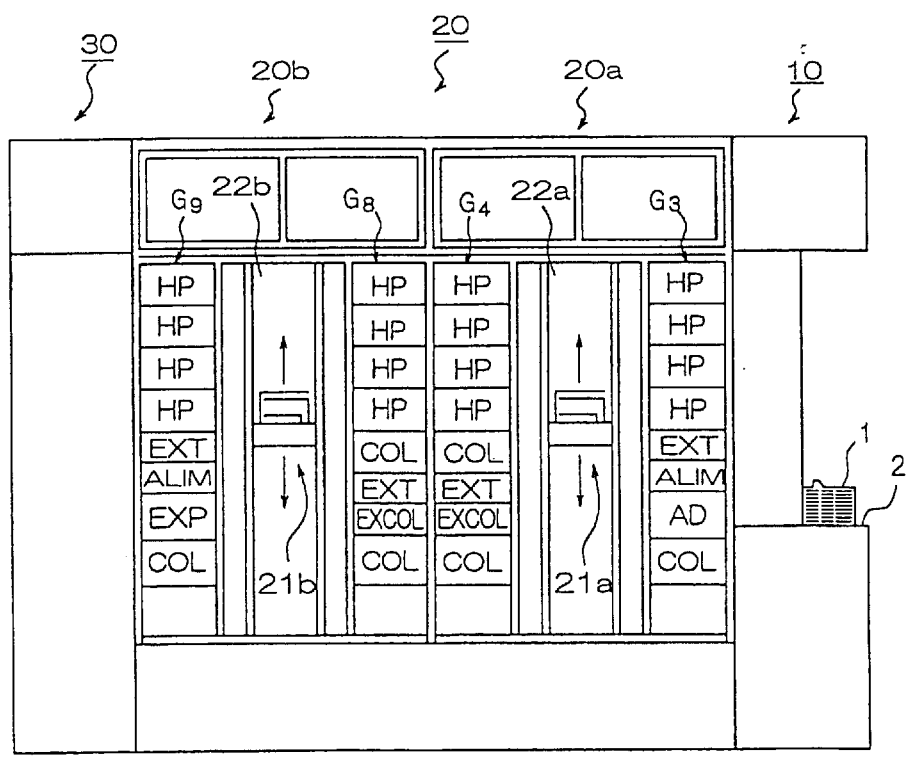
FIG. 3 is a rear view showing the resist solution coating and developing system in FIG. 1.

FIG. 1 is a schematic plan view showing a resist solution coating and developing system used for embodying the present invention, FIG. 2 is a front view of FIG. 1, and FIG. 3 is a rear view of FIG. 1.

This system includes a cassette station 10 as a transfer station, a processing station 20 having a plurality of processing units, and an interface section 30 for transferring a wafer W from/to the processing station 20 to/from an aligner 40 provided adjacent thereto.

The cassette station 10 is provided for carrying a plurality of, for example, 25 semiconductor wafers W (hereinafter referred to only as wafers) as objects to be processed, as a unit, housed in a wafer cassette 1, out of/into another system into/out of this system, and transferring the wafer W between the wafer cassette 1 and the processing station 20.

In this cassette station 10, as shown in FIG. 1, a plurality of (four in FIG. 1) projections 3 are formed along an X-direction in FIG. 1 on a cassette mounting table 2, and the wafer cassettes 1 can be mounted in a line with respective wafer transfer ports facing the side of the processing station 20 at the positions of the projections 3. In the wafer cassette 1, the wafers W are arranged in a vertical direction (a Z-direction). The cassette station 10 has a wafer transfer mechanism 4 disposed between the wafer cassette mounting table 2 and the processing station 20. The wafer transfer mechanism 4 has a wafer transfer arm 4a movable in the direction of arrangement of the cassettes (the X-direction) and in the direction of arrangement of the wafers W housed therein (the Z-direction) and can selectively get access to any of the wafer cassettes 1 by the arm 4a. The wafer transfer arm 4a is structured to be rotatable in a θ-direction so that it is accessible to an alignment unit (ALIM) and an extension unit (EXT) which are included in a processing section $G_3$ on the processing station 20 side which will be described later.

The processing station 20 includes a plurality of processing units for carrying out a series of processes when coating and developing processing is performed for the wafer W. The plurality of processing units are multi-tiered at predetermined positions, and the wafers W are processed one by one by these units. As shown in FIG. 1, the processing station 20 has two processing blocks 20a and 20b. The processing blocks 20a and 20b have transfer paths 22a and 22b respectively in the middle thereof, and main wafer transfer mechanisms 21a and 21b movable along the vertical direction inside the transfer paths are provided. All the processing units are arranged around the wafer transfer paths 22a and 22b. These plurality of processing units are divided into a plurality of processing sections, and a plurality of processing units are multi-tiered along the vertical direction in each processing section. In this embodiment, five processing sections $G_1$, $G_2$, $G_3$, $G_4$, and $G_5$ are arranged around the wafer transfer path 22a in the processing block 20a, and five processing sections $G_6$, $G_7$, $G_8$, $G_9$, and $G_{10}$ are arranged around the wafer transfer path 22b in the processing block 20b, whereby the wafer transfer paths 22a and 22b are spaces almost closed.

Out of these processing sections, the processing sections $G_1$, $G_2$, $G_6$, and $G_7$ are arranged in a raw on the front side of the system (on the lower side in FIG. 1), the processing section $G_3$ is arranged adjacent to the cassette station 10, the processing section $G_9$ is arranged adjacent to the interface section 30, the processing sections $G_4$ and $G_8$ are arranged adjacent to each other in the center of the processing station 20, and the processing sections $G_5$ and $G_{10}$ are arranged on the rear side.

In the above case, as shown in FIG. 2, in the processing section $G_1$ of the processing block 20a, two spinner-type processing units in each of which the wafer W is mounted on a spin chuck (not illustrated) inside a cup 23 to undergo predetermined processing are vertically two-tiered. In this embodiment, a resist coating unit (COT1) for applying a resist onto the wafer W and a developing unit (DEV1) for developing a pattern of the resist are two-tiered from the bottom in order. Similarly in the processing section $G_2$, a resist coating unit (COT2) and a developing unit (DEV2) as two spinner-type processing units are two-tiered from the bottom in order. As will be described later, an interlayer coating unit (COT3) for applying a predetermined solution, for example a solution of water soluble resin onto a resist film of the wafer W to form an interlayer and a developing unit (DEV3) are two-tiered from the bottom in order in the processing section $G_6$ of the processing block 20b, and a photosensitive layer coating unit (COT4) for applying a solution having a photosensitive radical onto the interlayer to form a photosensitive layer and a developing unit (DEV4) are two-tiered from the bottom in order.

The reason why the resist coating unit (COT1) and the like are disposed on the lower tier side is that drainage of a resist solution is essentially more complex in terms of both mechanism and maintenance than that of a developing solution, and that the complexity is mitigated by disposing the coating unit (COT1) and the like on the lower tier as described above. It is possible, however, to arrange the resist coating unit (COT1) and the like on the upper tier as required.

As shown in FIG. 3, in the processing section $G_3$ of the processing block 20a, oven-type processing units in each of which the wafer W is placed on a mounting table 24 to undergo predetermined processing are multi-tiered. Specifically, a cooling unit (COL) for performing cooling processing, an adhesion unit (AD) for performing so-called hydrophobic processing to enhance fixedness of the resist, an alignment unit (ALIM) for performing alignment, an extension unit (EXT) for carrying the wafer W in and out, and four hot plate units (HP) for performing heat processing for the wafer W before and after exposure processing and after developing processing are eight-tiered from the bottom in order.

In the processing section $G_4$, oven-type processing units are multi-tiered. Specifically, a cooling unit (COL), an extension and cooling unit (EXTCOL) which is a wafer transfer section provided with a cooling plate, an extension unit (EXT), a cooling unit (COL), and four hot plate units (HP) are eight-tiered from the bottom in order.

The aforesaid arrangement of the cooling unit (COT) and the extension and cooling unit (EXTCOL) having low processing temperature at the lower tiers and the hot plate units (HP) having high processing temperature at the upper tiers, can reduce thermal mutual interference between units. Random multi-tiered arrangement is naturally suitable.

The processing section $G_8$ of the processing block 20b has the same structure as the processing section $G_4$. A cooling unit (COL), an extension and cooling unit (EXTCOL), an extension unit (EXT), a cooling unit (COL), and four hot plate units (HP) are eight-tiered from the bottom in order.

The processing section $G_9$ has the same structure as the processing section $G_3$ except that an exposure unit (EXP) is disposed in place of the adhesion unit (AD). A cooling unit (COL), an exposure unit (EXP), an alignment unit (ALIM), an extension unit (EXT), and four hot plate units (HP) are disposed from the bottom in order. The exposure unit (EXP) is provided for performing processing characteristic of the present invention, that is, for exposing the entire surface of the photosensitive layer formed on the resist film all at once, for example, as will be described later.

Figure 4:
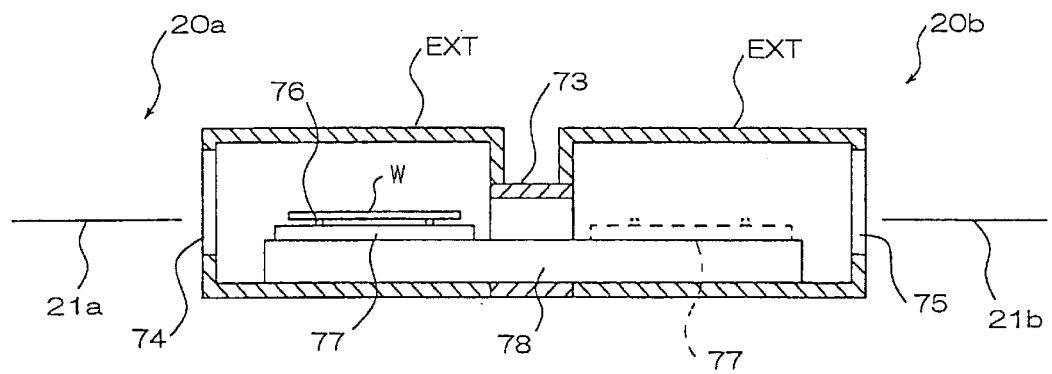
FIG. 4 is a sectional view showing extension units which connect processing sections in the resist solution coating and developing system in FIG. 1.

The processing section $G_4$ of the processing block 20a and the processing section $G_8$ of the processing block 20b are arranged adjacent to each other as described above, so that the wafer W can be transferred between the processing block 20a and the processing block 20b via the extension unit (EXT) of the processing section $G_4$ and the extension unit (EXT) of the processing section $G_8$. As shown in FIG. 4, for example, the extension unit (EXT) of the processing section $G_4$ and the extension unit (EXT) of the processing section $G_8$ communicate with each other with a communicating path 73 between them. In these extension units (EXT), openings 74 and 75 respectively for receiving and sending the wafer W from/to the main wafer transfer mechanisms 21a and 21b in the processing blocks 20a and 20b are provided. Further in these extension units (EXT), a holding plate 77 provided with a plurality of, for example, three supporting pins 76 for supporting the wafer W and a transport mechanism 78 for transporting the holding plate 77 between the extension units (EXT) via the communicating path 73. After receiving the wafer W from the main wafer transfer mechanism 21a in the processing block 20a while being transported into the extension unit (EXT), for example, the holding plate 77 is transported into the adjoining extension unit (EXT) by the transport mechanism 78 and delivers the wafer W to the main wafer transfer mechanism 21b in the processing block 20b.

The processing sections $G_5$ and $G_{10}$ disposed on the rear side of the main wafer transfer mechanism 21 also have the structure in which oven-type processing units are multi-tiered, basically likewise with the processing sections $G_3$, $G_4$, $G_8$, and $G_9$. These processing sections $G_5$ and $G_{10}$ can move along guide rails 25 laterally when viewed from the main wafer transfer mechanism 21. Therefore, space portions are secured by sliding the processing sections $G_5$ and $G_{10}$, thereby making it possible to easily carry out maintenance operations for the main wafer transfer mechanisms 21a and 21b from the rear side. The processing sections $G_5$ and $G_{10}$, however, may be provided as required, and hence they are not indispensable.

The aforesaid interface section 30 is the same as the processing station 20 in X-directional length. As shown in FIG. 1 and FIG. 2, a transportable pickup cassette 31 and a fixed buffer cassette 32 are two-tiered at the front of the interface section 30, a peripheral aligner 33 is disposed at the rear thereof, and a wafer transfer arm 34 is disposed at the center thereof. The wafer transfer arm 34 moves in the X-direction and the Z-direction so as to transfer the wafer to both the cassettes 31 and 32, and the peripheral aligner 33. The wafer transfer arm 34 is rotatable in the θ-direction so as to transfer the wafer W to the extension unit (EXT) included in the processing section $G_9$ of the processing block 20b of the processing station 20 and also to a wafer delivery table (not illustrated) on the adjacent aligner side.

Figure 5:
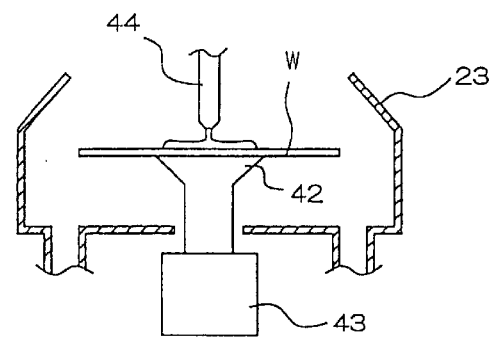
FIG. 5 is a sectional view showing a resist coating unit used in the system in FIG. 1.

Each of the resist coating units (COT1 and COT2), the interlayer coating unit (COT3), and the photosensitive layer coating unit (COT4) has a cup 23, a spin chuck 42 for vacuum-holding the wafer W horizontally inside the cup 23, a motor 43 for rotating the spin chuck 42, and a nozzle 44 for supplying a coating solution such as a resist solution as shown in FIG. 5. When the resist solution is applied, the resist solution is spread over the entire surface of the wafer W by the spin chuck 42 and the vacuum-held wafer W being rotated by the motor 43 while the coating solution is being supplied to the center of the wafer W from the nozzle 44, thereby forming the resist film. Also, when the interlayer and the photosensitive layer are formed, solutions are applied in the same procedure as above. Moreover, it is suitable to apply the solutions by using a nozzle with a wide width and scan-moving the nozzle.

Figure 6:
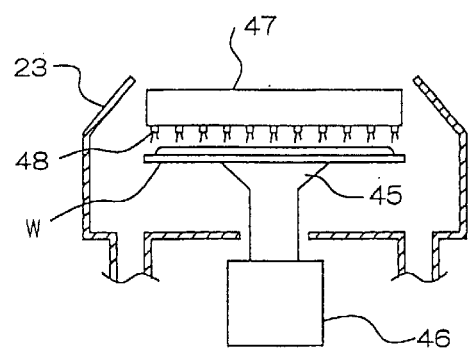
FIG. 6 is a sectional view showing a developing unit used in the system in FIG. 1.

Each of the developing units (DEV1 to DEV4) has the cup 23, a spin chuck 45 for vacuum-holding the wafer W horizontally inside the cup 23, a motor 46 for rotating the spin chuck 45, and a nozzle 47 for supplying a developing solution as shown in FIG. 6. The nozzle 47 has almost the same width as the wafer W, and it is provided with many developing solution discharge portions 48 over its entire width at the bottom thereof. The spin chuck 45 and the vacuum-held wafer W are rotated once by the motor 46 while the developing solution is discharged from each of the discharge portions 48 of the nozzle 47, thereby forming a developing solution puddle on the wafer W. The wafer W stands still in this state, and developing processing progresses by natural convection. After a lapse of a predetermined period of time, the developing solution is blown off by rotating the wafer W, and then a rinse solution is discharged from a rinse nozzle not illustrated to wash away the developing solution remaining on the wafer W. Subsequently, the wafer W is rotated at a high speed, whereby the developing solution and the rinse solution remaining on the wafer W are blown away so that the wafer W is dried. Incidentally, when the developing solution puddle is formed, the nozzle 47 may be scan-moved. In the present invention, as will be described later, since developing progresses all at once after the developing solution is applied, coating time, impact of the developing solution and the like do not need to be considered. As a result, the developing solution nozzle may have a simpler structure like a straight nozzle.

Next, the procedure for putting a method of the present invention into practice by means of the system structured as above will be explained.

First, in the cassette station 10, the wafer transfer arm 4a of the wafer transfer mechanism 4 gets access to the cassette 1 housing unprocessed wafers W on the cassette mounting table 2 and takes one wafer W out of the cassette 1. The wafer W is transferred to the extension unit (EXT), and thence carried into the processing block 20a by an arm of the main wafer transfer mechanism 21a. Subsequently, after being aligned in the alignment unit (ALIM) included in the processing section $G_3$, the wafer W undergoes hydrophobic processing in the adhesion unit (AD) disposed thereunder.

The wafer W for which adhesion processing is completed is cooled in any one of the cooling units (COL) of the processing block 20a, and then the resist is applied in the coating unit (COT1) of the processing section $G_1$ or the coating unit (COT2) of the processing section $G_2$ in the aforesaid procedure. Subsequently, after undergoing prebake processing in any one of the hot plate units (HP) of the processing sections $G_3$ and $G_4$, the wafer W is cooled in any one of the cooling units (COL).

Thereafter, the wafer W is transferred to the processing block 20b via the extension units (EXT) or the extension and cooling units (EXTCOL) of the processing sections $G_4$ and $G_8$, aligned in the alignment unit (ALIM) of the processing section $G_9$, and then transferred to the interface section 30 by means of an arm of the main wafer transfer mechanism 21b.

In the interface section 30, peripheral exposure by the peripheral aligner 33 is carried out, and thereafter the wafer W is taken to the adjoining aligner 40, where exposure processing is performed for the resist film of the wafer W in accordance with a predetermined pattern.

After exposure processing is completed, the wafer W is transferred to the extension unit (EXT) included in the processing section $G_9$ by means of the wafer transfer arm 34 of the interface section 30 and thence carried into the processing block 20b by the arm of the main wafer transfer mechanism 21b. The wafer W is then transferred to any one of the hot plate units (HP) of the processing sections $G_9$ and $G_8$ to undergo post-exposure bake processing, and cooled in any one of the cooling units (COL).

Thereafter, developing processing is performed in the procedure shown in FIG. 7(A) to FIG. 7(H) for the wafer W which has undergone post-exposure bake processing as described above.

Figure 7:
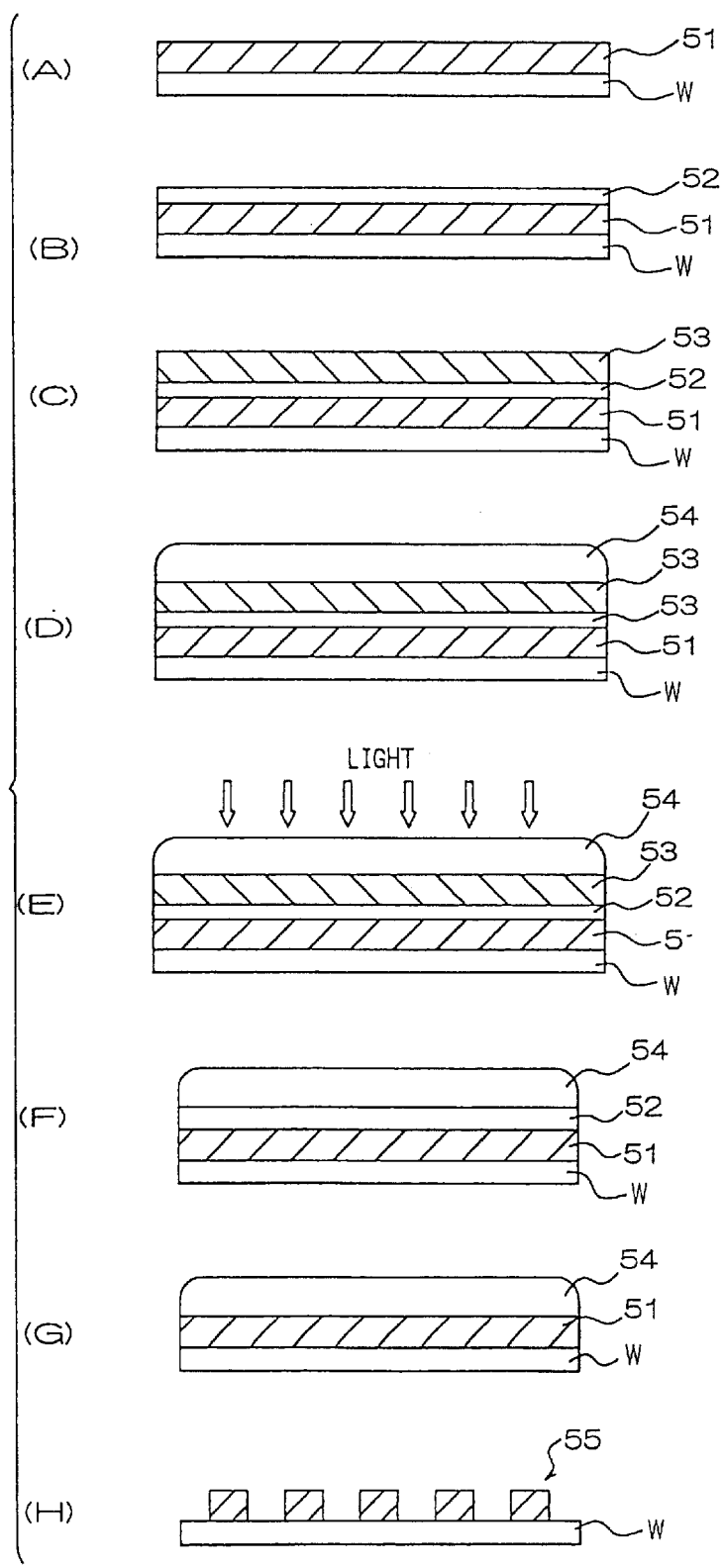
FIG. 7(A) to FIG. 7(H) are sectional views showing the steps of a developing method according to an embodiment of the present invention.

An interlayer 52 is formed by applying a predetermined solution in the aforesaid procedure in the interlayer coating unit (COT3) of the processing section $G_6$ as shown in FIG. 7(B) with a resist film 51 for which exposure and post-exposure bake processing are completed being formed on the wafer W as shown in FIG. 7(A). Water soluble resin, for example, polyvinyl alcohol (PVA) is used as the interlayer 52, and the interlayer 52 about 30 nm in thickness is formed. Incidentally, if a solution composing the photosensitive layer directly touches the resist film 51 when a photosensitive layer formed on the interlayer 52 is an organic series, the resist dissolves in the solution, whereby the interlayer 52 is provided to prevent the above phenomenon. Accordingly, if the resist film 51 does not dissolve even though the photosensitive layer directly touches the resist film 51, the interlayer 52 does not need to be provided.

After the interlayer 52 is thus formed, baking processing is performed in any of the hot plate units (HP), and then a solution having a photosensitive radical is applied in the aforesaid procedure in the photosensitive layer coating unit (COT4) of the processing section $G_7$ to form a photosensitive layer 53 as shown in FIG. 7(C). The solution having the photosensitive radical composing the photosensitive layer 53 is not especially limited, but a water soluble solution is preferable, and a G-line resist, diazonium salts, or the like is more preferable. The use of the G-line resist can remarkably raise the subsequent developing rate, which can reduce the developing time nearly to half. When the water soluble solution is used as described above, the solution does not basically dissolve the resist film. Hence, the interlayer 52 is not necessarily needed.

After the photosensitive layer 53 is thus formed, baking processing is performed in any of the hot plate units (HP), and subsequently a developing solution is applied in the aforesaid procedure in any of developing units (DEV1 to DEV4) to form a developing solution puddle 54 as shown in FIG. 7(D).

Thereafter, the wafer W is transferred to the exposure unit (EXP) of the processing section $G_9$, where light is irradiated as shown in FIG. 7(E). Thus, the entire surface of the photosensitive layer 53 is exposed all at once through the developing solution.

The photosensitive layer 53 of which the entire surface is exposed becomes soluble in the developing solution, and is dissolved by the developing solution puddle 54 as shown in FIG. 7(F). Further, the interlayer 52 is also dissolved as shown in FIG. 7(G). As a result, the developing solution comes into direct contact with the resist film 51, whereby the developing of the resist film 51 progresses. Thus, a predetermined resist pattern 55 is formed as shown in FIG. 7(H).

As described above, the solution having the photosensitive radical is applied onto the resist film 51, via the interlayer 52 if required, to form the photosensitive layer 53, and the developing solution is applied thereonto to form the developing solution puddle 54, and thereafter the entire surface of the photosensitive layer 53 is exposed all at once by UV light, whereby the developing of the resist film 51 progresses all at once after the photosensitive layer 53 dissolves in the developing solution. Consequently, time difference in the start time of developing does not occur in the surface of the wafer W, which makes it possible to develop the wafer W uniformly and to improve the line width uniformity (CD value uniformity) in the surface of wafer. Further, since developing progresses all at once after the developing solution is applied, the time to heap up the developing solution is not restricted and the reduction of impact of the developing solution and the like do not need to be considered. As a result, a developing solution nozzle can be structured more simply than the aforesaid nozzle 45. Furthermore, the developing solution does not directly attack the resist film 51, thereby decreasing defects. Especially, since the G-line resist is hydrophilic, it draws in bubbles less frequently than other hydrophobic resists, thus further reducing defects and failures.

After the developing processing is completed as described above, post-bake processing is performed in any of the hot plate units (HP), and cooling processing is performed in any of the cooling units (COL). Thereafter, the wafer W is mounted on a mounting table of the extension unit (EXT) by means of the arm of the main wafer transfer mechanism 21a of the processing block 20a. The wafer W on the mounting table is received by the arm 4a of the cassette station 10, and put in a predetermined wafer housing slot of the cassette 1 for housing processed wafers on the cassette mounting table 2. Thus, a series of processing is completed.

It should be mentioned that the present invention is not limited to the aforesaid embodiment, and various changes may be made therein.

Figure 8:
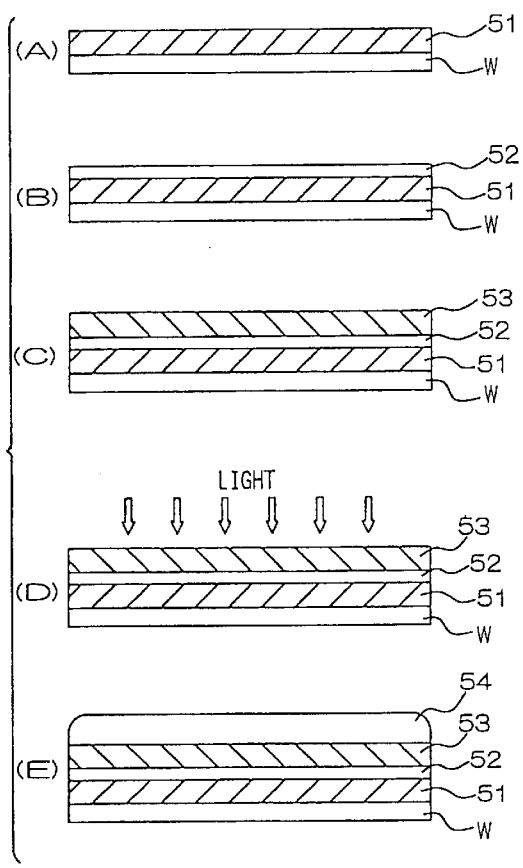
FIG. 8(A) to FIG. 8(E) are sectional views showing the steps of a developing method according to another embodiment of the present invention.

For example, the procedure of developing processing is not limited to the one shown in FIG. 7(A) to FIG. 7(H), but the procedure shown in FIG. 8(A) to FIG. 8(E) is also suitable. Namely, as shown in FIG. 8(A) to FIG. 8(C), after the same processing as that in FIG. 7(A) to FIG. 7(C) is performed, the developing solution puddle 54 may be formed as shown in FIG. 8(E) after the photosensitive layer 53 is exposed as shown in FIG. 8(D). Since the photosensitive layer 53 first dissolves in the developing solution also in this case, time difference in the start time of developing is not prone to occur, thereby obtaining expected effects. Further, the quantity of light of a G-line can be decreased, thereby making an expensive exposure lamp for the G-line downsized and less expensive. Furthermore, the exposure of the G-line can be performed outside the developing unit, which makes it possible to use the existing developing unit without remodeling it.

Figure 9:
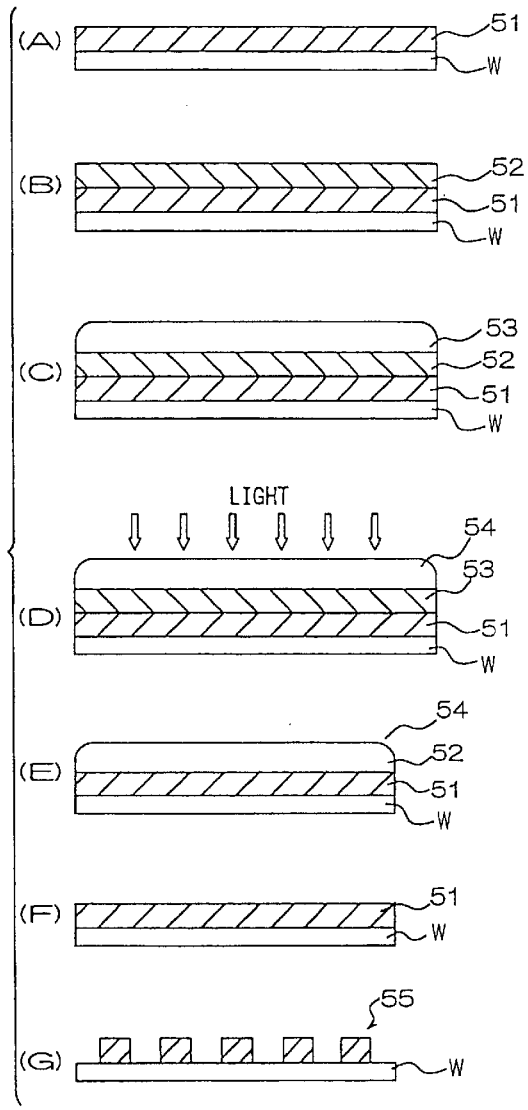
FIG. 9(A) to FIG. 9(G) are sectional views showing the steps of a developing method according to still another embodiment of the present invention.

Although the interlayer 52 is formed in the aforesaid embodiment, processing may be performed without the formation of the interlayer as shown in FIG. 9. In processing shown in FIG. 9(A) to FIG. 9(G), a step of forming the interlayer is omitted from the processing shown in FIG. 7(A) to FIG. 7(H). By eliminating the interlayer as described above, dissolved substances of the photosensitive layer 53 and the developing solution are mixed when the photosensitive layer 53 is dissolved by the developing solution puddle 54, thereby improving the function as the developing solution and shortening the developing processing time. Moreover, by eliminating the interlayer as described above, a mixing layer which does not easily dissolve in the developing solution is formed on the surface layer of the resist film 51 by changing the conditions required for coating the photosensitive layer 53, for example, so that the rotation drying time is reduced from usual 30 seconds to 15 seconds. Developing solubility is lowered owing to the mixing layer, whereby the upper corner portions of the resist pattern 55 are square without bending, thus forming a more accurate resist pattern.

Figure 10:
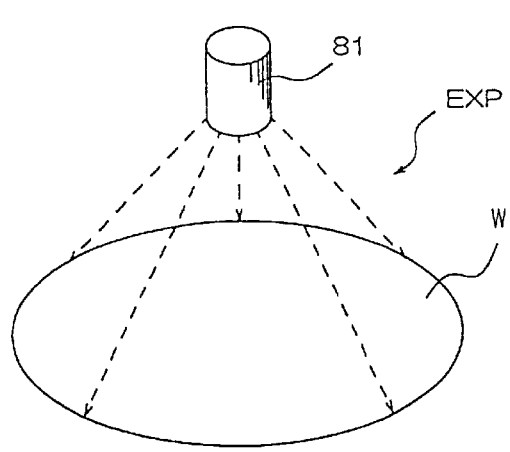
FIG. 10 is a view showing one example of an exposure lamp.

The use of a lamp 81 of the type of irradiating the entire surface of the wafer W as shown in FIG. 10 as an exposure lamp in the exposure unit (EXP) for exposing the photosensitive layer 53 enables the entire surface of the wafer to be exposed all at once.

Figure 11:
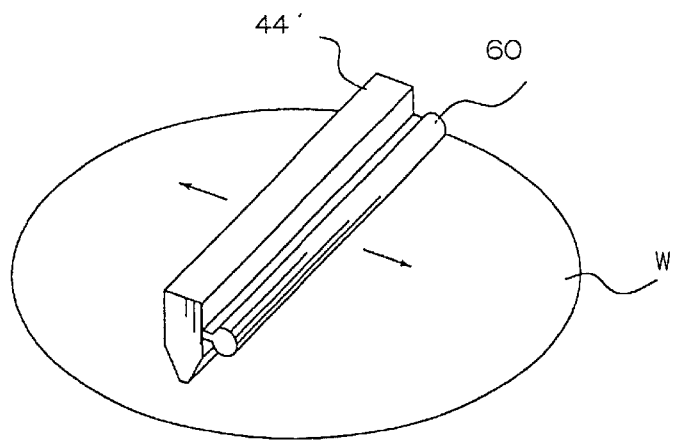
FIG. 11 is a perspective view showing a modified example of a photosensitive layer coating unit.
Figure 12:
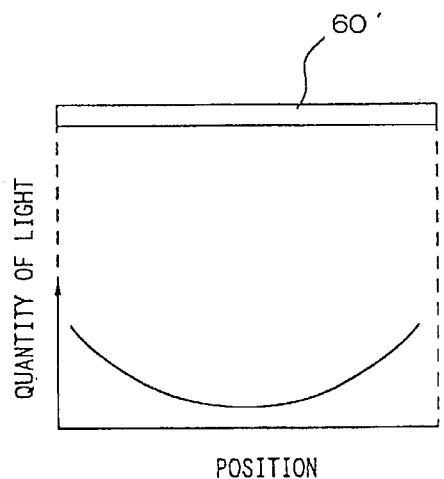
FIG. 12 is a diagram showing positions of the exposure lamp and the quantity of light in each position.

Further, although the exposure unit (EXP) is provided in order to expose the photosensitive layer 53 in the aforesaid embodiment, only the exposure of the entire surface of the photosensitive layer 53 is required in the present invention, and such a unit used exclusively for exposure is not necessarily needed. For example, a scan-type nozzle 44' with a large width is used in a coating unit when the solution having the photosensitive radical is applied as shown in FIG. 11, and a scan-type exposure lamp 60 with a large width is attached to the nozzle 44'. Thereby, the entire surface can be exposed by scan-moving the nozzle. The above scan-type exposure lamp 60 with the large width may be disposed in the exposure unit (EXP). When a wide type exposure lamp 60' is used and the wafer W is rotated thereunder, the use of the lamp of a type in which the quantity of light thereof is decreased toward the center thereof as shown in FIG. 12 enables efficient exposure, thereby reducing the lamp in size and giving a merit in space. Moreover, the use of the wide type exposure lamp 60 enables the formation of a finer and more uniform resist pattern.

According to experimentation by the present inventor, et al., a distance to a substrate is necessary for exposure of the entire surface all at once with the exposure lamp of the type shown in FIG. 10. Since illumination intensity is inversely proportional to the square of a distance, a lamp with high illumination intensity is needed, and moreover the uniformity of illumination intensity is difficult to obtain. The use of the scan-type exposure lamp with the large width, however, makes it possible to place the lamp closer to the substrate, whereby even a lamp with low illumination intensity can be used, thereby reducing consumed electric power. Moreover, uniformity is easy to obtain, and line width uniformity even after developing is 3σ8 nm or less.

Furthermore, a substrate is not limited to a semiconductor wafer, but the present invention can be applied to various substrates such as an LCD substrate, a glass substrate, a CD substrate, a photo mask, and a printed board.

As explained above, according to the present invention, the solution having the photosensitive radical is applied onto the resist film, the developing solution is applied thereonto, and the entire surface of the solution having the photosensitive radical is exposed all at once. As a result, developing of the resist film progresses all at once after the coating film of the solution having the photosensitive radical dissolves in the developing solution, and hence time difference in the start time of developing does not occur in the surface of the substrate, thereby enabling uniform developing and an improvement in line width uniformity (CD value uniformity) in the surface of the substrate. Further, since developing progresses all at once after the developing solution is applied, the time to heap up the developing solution is not restricted and the reduction of impact of the developing solution and the like do not need to be considered. As a result, the structure of a developing solution supply nozzle can be simplified. Furthermore, the developing solution does not directly attack the resist film, thereby decreasing defects.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A developing method for exposing a resist film formed on a substrate in a predetermined pattern and thereafter developing the exposed pattern, comprising the steps of:
   (a) exposing the resist film formed on the substrate in the predetermined pattern:
   (b) post-exposure baking the substrate:
   (c) applying a solution having a photosensitive radical onto the entire upper surface of the resist film on the substrate;
   (d) applying a developing solution onto the entire upper surface of the applied solution; and
   (e) exposing the entire surface of the solution having the photosensitive radical applied onto the resist film via the developing solution.

2. The method as set forth, in claim 1, wherein the entire surface of the solution is exposed all at once in said step (e).

3. The method as set forth in claim 1, wherein the entire surface of the solution is exposed by scan-moving a light source for exposure in said step (e).

4. The method as set forth in claim 1, further comprising the step of:
   forming an interlayer between the solution having the photosensitive radical and the resist film.

5. The method as set forth in claim 4, wherein the interlayer is formed by applying water soluble resin.

6. The method as set forth in claim 1, wherein said step (e) is performed after said step (b).

7. The method as set forth in claim 1, wherein said step (c) is performed after said step (e).

8. The method as set forth in claim 1, wherein the solution having the photosensitive radical is a G-line resist solution.

9. The method as set forth in claim 1, wherein the solution having the photosensitive radical is a substance containing diazonium salts.

10. A developing method for exposing a resist film formed on a substrate in a predetermined pattern and thereafter developing the exposed pattern, comprising the steps of:
    (a) exposing the resist film formed on the substrate in the predetermined pattern;
    (b) post-exposure baking the substrate;
    (c) applying a solution having a photosensitive radical onto the entire upper surface of the resist film on the substrate;
    (d) applying a developing solution onto the entire upper surface of the applied solution; and
    (e) exposing the entire surface of the solution having the photosensitive radical applied onto the resist film via the developing solution and developing the resist film by the developing solution and the dissolved solution.

* * * * *